United States Patent
Cohn et al.

(10) Patent No.: US 7,373,567 B2
(45) Date of Patent: May 13, 2008

(54) SYSTEM AND METHOD OF PROVIDING ERROR DETECTION AND CORRECTION CAPABILITY IN AN INTEGRATED CIRCUIT USING REDUNDANT LOGIC CELLS OF AN EMBEDDED FPGA

(75) Inventors: John M. Cohn, Richmond, VT (US); Christopher B. Reynolds, Underhill, VT (US); Sebastian T. Ventrone, South Burlington, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 624 days.

(21) Appl. No.: 10/709,754

(22) Filed: May 26, 2004

(65) Prior Publication Data

US 2005/0278588 A1     Dec. 15, 2005

(51) Int. Cl.
*G01R 31/28* (2006.01)
(52) U.S. Cl. .............................. 714/725; 714/3; 714/8; 714/25; 714/48; 714/723; 714/726; 714/727; 714/729; 714/741; 714/746
(58) Field of Classification Search ..................... None
See application file for complete search history.

(56) References Cited

U.S. PATENT DOCUMENTS

| | | | |
|---|---|---|---|
| 5,511,211 A * | 4/1996 | Akao et al. ..................... 712/36 |
| 5,633,806 A * | 5/1997 | Yusa et al. ..................... 716/16 |
| 5,701,441 A * | 12/1997 | Trimberger ..................... 716/16 |
| 6,175,940 B1 * | 1/2001 | Saunders ..................... 714/746 |
| 6,545,501 B1 * | 4/2003 | Bailis et al. ..................... 326/10 |
| 6,742,172 B2 * | 5/2004 | Park ..................... 716/16 |
| 6,744,274 B1 * | 6/2004 | Arnold et al. ..................... 326/16 |
| 6,829,751 B1 * | 12/2004 | Shen et al. ..................... 716/4 |
| 6,991,947 B1 * | 1/2006 | Gheewala ..................... 438/15 |
| 7,143,329 B1 * | 11/2006 | Trimberger et al. ......... 714/746 |
| 7,185,293 B1 * | 2/2007 | Ofer ..................... 716/1 |
| 2002/0066956 A1 * | 6/2002 | Taguchi ..................... 257/734 |

* cited by examiner

*Primary Examiner*—John P Trimmings
(74) *Attorney, Agent, or Firm*—Scully, Scott, Murphy & Presser, P.C.; Michael J. LeStrange, Esq.

(57) ABSTRACT

A system and method of providing error detection and correction capability in an IC using redundant logic cells and an embedded field programmable gate array (FPGA). The system and method provide error correction (EC) to enable a defective logic function implemented within an IC chip design to be replaced, wherein at least one embedded FPGA is provided in the IC chip to perform a logic function. If a defective logic function is identified in the IC design, the embedded FPGA is programmed to correctly perform the defective logic function. All inputs in an input cone of logic of the defective logic function are identified and are directed into the embedded FPGA, such that the embedded FPGA performs the logic function of the defective logic function. All outputs in an output cone of logic of the defective logic function are identified, and the output of the FPGA is directed to the output cone of logic of the defective logic function, such that logic EC is provided within the embedded FPGA structure of the IC chip.

19 Claims, 2 Drawing Sheets

LOGIC CONES

STRUCTURE

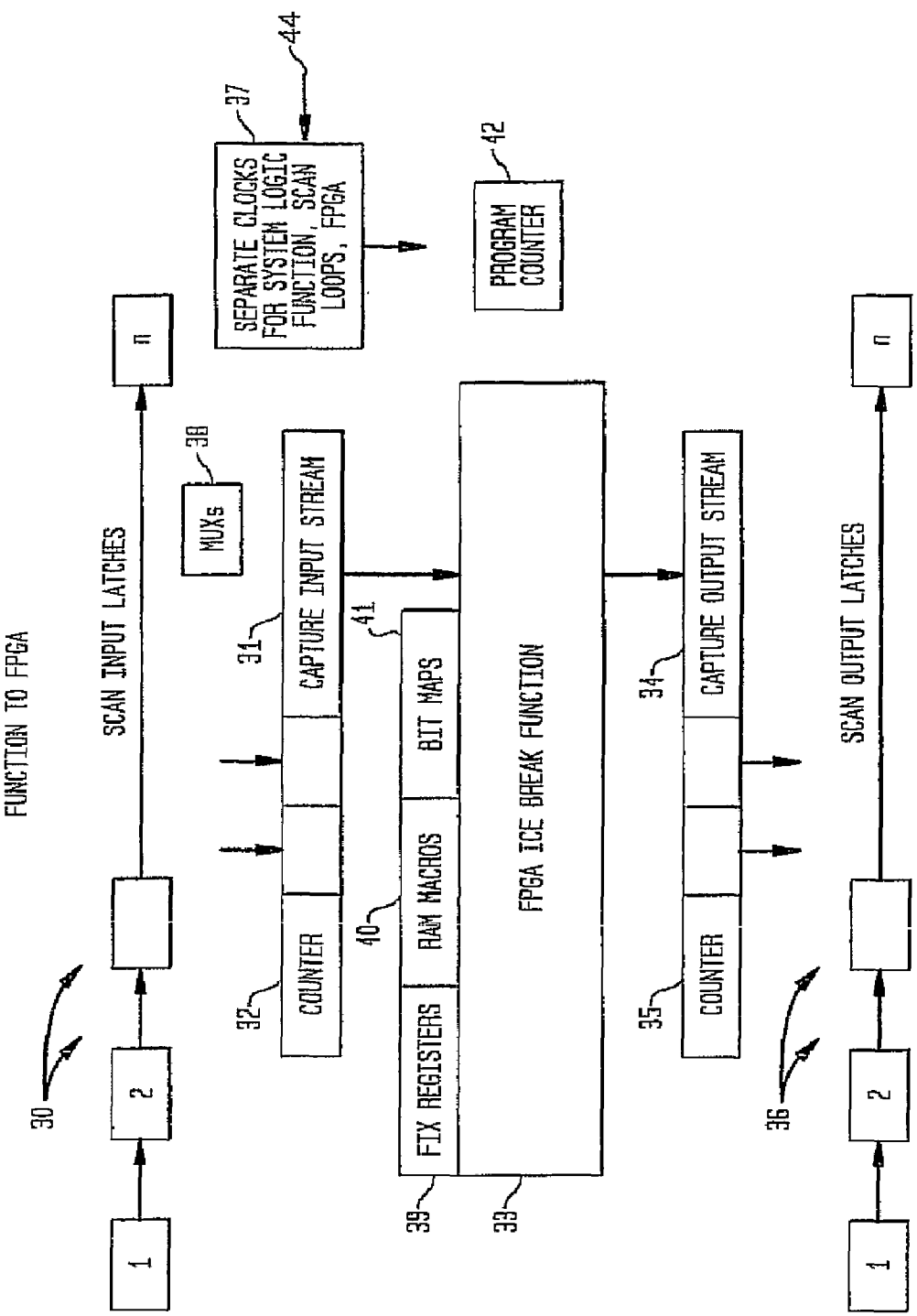

SYSTEM AND METHOD OF PROVIDING ERROR DETECTION AND CORRECTION CAPABILITY IN AN INTEGRATED CIRCUIT USING REDUNDANT LOGIC CELLS OF AN EMBEDDED FPGA

BACKGROUND OF INVENTION

1. Field of the Invention

The present invention relates generally to a system and method of providing error detection and correction capability in an integrated circuit (IC) using redundant logic cells and an embedded field programmable gate array (FPGA). The embedded FPGA provides for in circuit emulator (ICE) breakpoint and logic error correction (EC). The present invention provides flexible embedded logic engineering changes within the IC chip without requiring the contents of the latches of the logic function to be scanned to an external boundary, to make an EC change externally.

The EC method of the present invention can be used either during product design and development, or as a logic fix post-silicon fabrication. The subject invention also has application in evaluating error recovery of an IC chip design, wherein data errors can be injected through the embedded FPGA structures, and then the logic function IC design is evaluated as to how well it handles error recovery.

2. Discussion of the Prior Art

In the present state of the art, ICE structures have been designed and used primarily for debugging the development code of logic functions such as microprocessor IC logic functions. The ICE structures are used to monitor the operation of an instruction stream executing within a microprocessor IC. The primary function of the ICE structures is to debug development code by running an application code, setting a breakpoint in the execution of the application code, scanning the data in content registers, and mapping the data to a viewer screen. This allows a user to change the content of a memory image or register, and then continue to run the application code.

One limitation of current ICE structures is that they are not designed to fix logic structures or logic errors within the design of a microprocessor IC. The assumption of the ICE designed function is that the current microprocessor logic function works, and that the ICE structures are being used primarily for debugging the development code of the microprocessor logic function.

Present state of the art methods of designing an IC incorporate embedded logic EC structures in the IC that require the contents of the embedded logic EC structures to be scanned to an external boundary, and then any changes to the instruction stream are made externally.

SUMMARY OF INVENTION

The present invention provides a new type of EC structure and control for an IC design that enables the data signals to a defective logic function implemented within the IC design to be routed to embedded FPGA structures and the logic function fixed in another area of the IC design by a corrected logic function implemented in an embedded FPGA macro. Then the output of the corrected logic function is routed back to the return cone of logic of the defective logic function in such a way that logic EC is provided within the embedded FPGA structures of the IC chip. The present invention can be used either during product design and development, or as a program logic fix. The invention also has application in evaluating error recovery of an IC chip design, wherein data errors can be injected through the embedded FPGA structures, and then the logic function IC design is evaluated as to how well it handles error recovery.

The present invention is applicable to any standard IC cell design with embedded FPGA structures.

BRIEF DESCRIPTION OF DRAWINGS

The foregoing objects and advantages of the present invention for a system and method of providing error detection and correction capability in an IC using redundant logic cells and an embedded FPGA may be more readily understood by one skilled in the art with reference being had to the following detailed description of several embodiments thereof, taken in conjunction with the accompanying drawings, in which:

FIG. 3 illustrates the functions of an FPGA.

DETAILED DESCRIPTION

Figure 1:
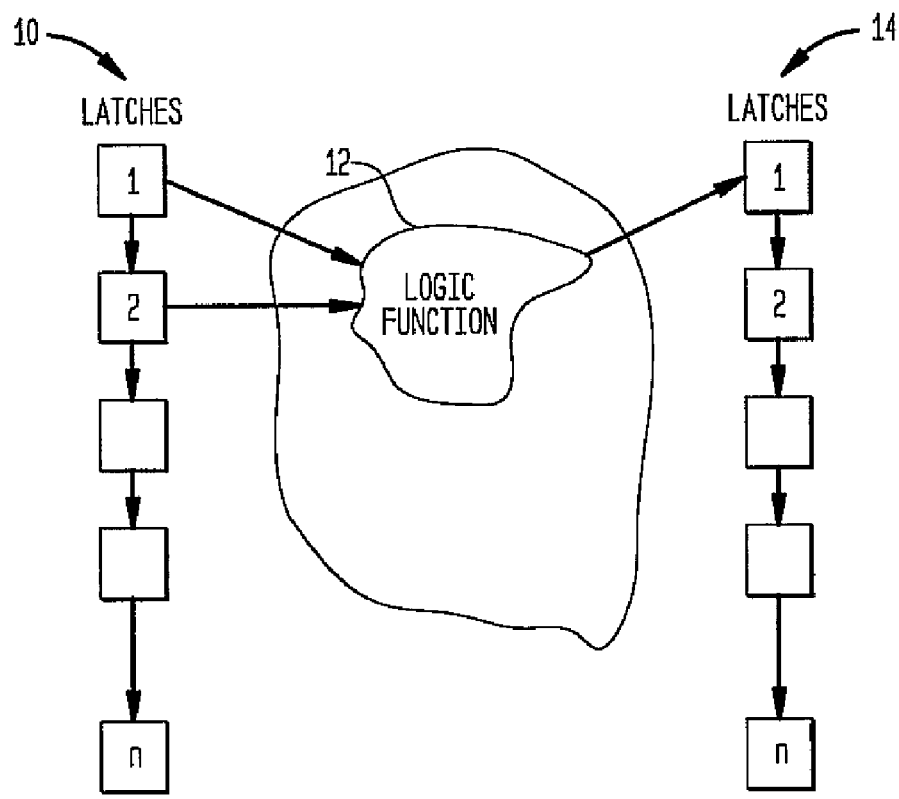
FIG. 1 illustrates the general concept of cones of logic existing in association with a logic function.

FIG. 1 illustrates the general concept of cones of logic existing in association with a logic function bounded by latches. A set of latches 1, 2 . . . n in a scan string 10 on the left form inputs to a logic function 12, which forms inputs to a set of latches 1, 2 . . . n in a scan string 14 on the right, forming an input cone of logic on the left and an output cone of logic on the right. The logic function 12 can be a logic cell, logic book, or any logic function typically comprised of AND, OR, NOR and other logic gates arranged to accomplish some logic function, such as to execute a truth table. The cone of logic can be traced upstream from the logic function 12 to determine all input latches to the logic function 12, and the cone of logic can be traced downstream from the logic function 12 to determine all output latches from the logic function 12. The logic function 12 is typically tested by scanning in a data test pattern from the input latches into the logic function, and then scanning the output of the logic function 12 in the output latches, and checking the output of the data pattern in the output latches to verify that it is the correct expected output and has no incorrect bits.

Figure 2:
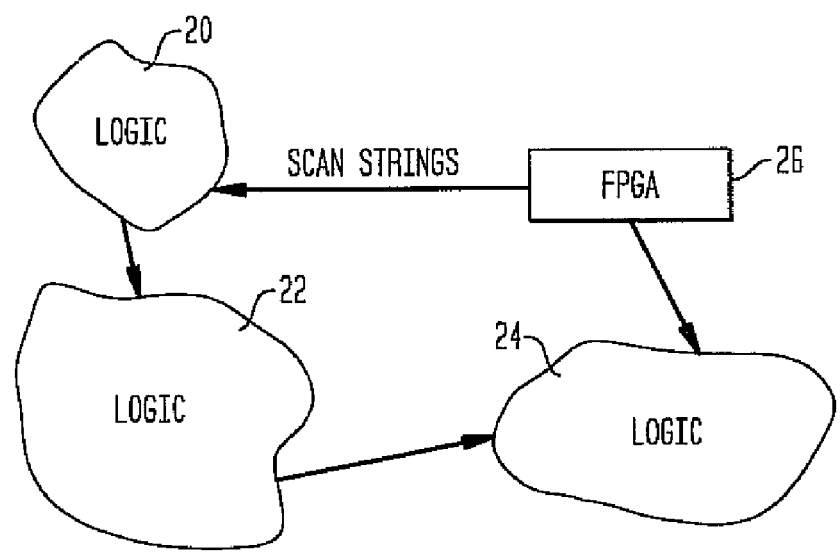
FIG. 2 illustrates the structure of a logic function pursuant to the present invention, which is represented by several different logic functions and one of a plurality of FPGA macros that are selectively scattered through the logic system of a microprocessor.

FIG. 2 illustrates the structure of an overall logic function pursuant to the present invention, which includes a first logic function 20, a second logic function 22, and a third logic function 24, and one of a plurality of FPGA macros 26 which are selectively scattered through the logic system, such as a microprocessor, implemented in an IC design. The FPGA macro 26 is connected by scan strings to the first logic function 20, the second logic function 22, and the third logic function 24.

FIG. 3 illustrates the functions of a FPGA 33. In general, once a defective logic function is detected in an IC design, the present invention identifies and captures all inputs in an input cone of logic of the defective logic function which are directed into the FPGA 33. This captures the input stream in all latches at the top of a logic tree that is being replaced by the FPGA of the present invention. FIG. 3 illustrates the scan input latches 1, 2 . . . n of an input scan chain 30 and the scan output latches 1, 2 . . . n of an output scan chain 36. The capture of all of the inputs in the input cone of logic of the defective logic function is represented schematically by Capture Input Stream 31 and Program Counter 32, using the techniques described in detail herein, which form inputs to the FPGA 33.

The FPGA 33 is programmed to accomplish the correct logic function, and after the capture of all input latches in the input cone of logic of the defective logic function, the FPGA performs the correct logic function, and then directs the outputs of the FPGA into the output cone of logic of the defective logic function, such that the logic function provided by the FPGA essentially replaces the defective logic function of the logic macro, also known in the art as a logic engine. The capture of all of the outputs in the output cone of logic of the FPGA is represented schematically by Capture Output Stream 34 and Program Counter 35.

The present invention provides a method that allows a breakpoint to be taken in the logic function. The clocks are frozen causing a pipeline freeze. The boundary scan is used to route the inputs to the capture latch inputting the FPGA. The FGPA replaces the defective logic function error with an FPGA corrected logic function. The boundary scan routes the results back to the destination latches of the original area of the logic function error, and the pipeline restarts.

In the ICE structure, a scan chain is modified to be a scan ring, enabling corrected data to be brought back to the point in the logic function where a bug in the logic function occurred. The clock is controlled to enable stalling normal operation of the macro or system logic function, starting the FPGA function independently of the system logic function, and scanning data to and from the FPGA. Handshaking signals to and from the FPGA control the overall function of the ICE. The FPGAs must have access to the scan chains, either directly or via separate mux (multiplexer) paths. Ideally, multiple scan chains (perhaps all) can be muxed into a single FPGA.

The present invention can incorporate multiple FPGA modes wherein FPGA structures are included in the design of the system logic function for normal operations as well as for EC fixes. The FPGAs are then time muxed to provide an EC capability in addition to their normal modes of operation. The FPGAs can be used to fix defective data either downstream or upstream from the defective logic.

In the routing of the logic cone to the FPGA, several methods exist for setting the breakpoints, the most likely being a combination of the current program counter, as indicated schematically by counters 32 and 35 in FIG. 3, and the total number of clock cycles.

The present invention can also provide flexible routing of scan chains if additional logic ECs are required.

The present invention routes scan chains through FPGAs and other related circuitry to fix defective data bits during logic debugging, and also perhaps during production for limited cases.

To fix defective data, the logic macro is put into a wait state. The bad data is scanned into the FPGAs, registers, and other circuitry designed to manipulate the scan data. The FPGA output is part of the scan chains which are part of the boundary scan to be able to route the resulting logic results back to points of destination. Multiple FPGAs can be strategically placed throughout the design of the logic function IC so that multiple scan chains can be fixed.

Alternatively, the scan chains can be muxed into a single FPGA, either a dedicated FPGA, or an FPGA that can be time muxed with it's normal system functions. The fixed data is scanned back around, upstream or downstream, to the origin of the fixed data, and the logic macro is taken out of its wait state.

A fix register can be preloaded with required data, or various sets of data, to cover cases of multiple fixes.

The process to repair specific defective logic involves the following steps: identifying defective logic; tracing logic cones of the defective logic forward and backward to register boundaries; identifying different fix scenarios (e.g. fixing bad bits, fixing upstream data, fixing downstream data); choosing one or several most efficient fix scenarios.

The process analyzes data flow with respect to each identified defect and identifies optimum points in the logic macro operation (i.e. clock cycle) to provide the most efficient fix.

The process can extract register transfer language (RTL) corresponding to the defective logic, identify RTL updates that are required, and assess if the RTL updates are feasible.

The process provides sufficient FPGA resources, provides fixed connections to the rest of the design of the logic macro of the microprocessor or other integrated logic functions, and is implemented in FPGA logic. The additional handshaking functions and the resulting RTL are provided to enable control flow for fix scenarios, and to merge RTL updates with the original untouched portion of the FPGA design.

To make use of the fixed bit(s), the system operation first identifies specific defect preconditions and associated clock cycles, and analyzes data flow and clock cycles of interest to identify optimum break point(s) in the logic macro operation for implementation of the EC fix.

There may be several options to provide an EC fix, and several options should be identified to minimize system operation and timing impact, and to stall the normal macro system operation at an optimum time(s) for the EC fix.

The design implementation can be provided with separate clocks 37 for the system logic function, on each scan chain, and the FPGA. The length of each scan chain can be padded such that all of the scan chains are identical in length, as information is not available on which scan chain the defect is on, and the correct information must be supplied to and obtained from the FPGA while disturbing the rest of the normal system operations in a minimal manner.

As indicated at 37, the clocks for the FPGA block are separate from the system clocks, by providing separate gating controls at a minimum, to allow operation of the logic macro to be stalled while running the EC fix within the FPGA, and to allow operation of the FPGA to be stalled while running the logic macro.

Other scan chains can be muxed, indicated schematically at 38, into the FPGA such that data can be steered from any one of multiple scan chains to an FPGA input. This is probably best accomplished by tapping off of the multiple input signature register (MISR) input where all of the scan chains come together. Likewise, the outputs of the FPGA scan chain can be muxed into the parallel scan chains. The FPGA logic can be provided on its own scan chain to ensure its operability. This muxing or demuxing might come to or from a fix register 39 as described below.

Sometimes the data that needs to be operated on and modified originates from more than one scan chain. There are two approaches to solve this problem.

A first approach provides a fix register 39, either internal or external to the FPGA (an internal fix register saves die area, but takes up FPGA resources). The clock and address control for the fix register are part of the implemented fix control logic.

The following represents the overall approach and scenario: the scan chains are muxed so that one of the scan chains that has needed defective data bits on it is active; scan this scan chain until the needed data bit(s) are read, and store the needed data bits in the fix register 39; then change the mux 38 set up to perform the same operation with other scan chains that have needed data bits; and finally, cycle through the fix register 39 and place the fix register output onto the FPGA scan chain.

A second alternative approach uses mux logic as follows: the scan chains are muxed as before so that one of the scan chains that has needed defective data bits on it is active, then clock the needed fix bit(s) onto the FPGA scan chain; and then change the mux 38 set up to insert to the next needed fix bit(s) from the next scan chain.

In this overall approach and scenario, the scan chains need to be loaded in the order that they are needed to load the FPGA correctly.

The fix register 39 is used to arrange the scan chains in the required order, and then merely apply the correct sequence of read addresses.

A key to either of these approaches is the use of separate scan clocks (and FPGA clocks), as indicated at 37, to advance the contents of one scan chain at a time independently of the other scan chains and the FPGA.

As a part of the scan function, a set of RAM macros 40 or other storage device(s) are set to program which bits of the scan string are used to set the input register of the FPGA macros, and also upon startup, which bits of the scan string are replaced with bits from the output register of the FPGA macros.

Based upon bit mapping 41 of the scan chain data, as the scan chain bits pass through the input fix register, a hold latch is provided to capture an incoming bit stream. If the program count is a match, an output latch captures the correct logic EC scan bit(s).

In a parallel manner, at the output stage of the FPGA, provide a mux path of the latch output of the FPGA function, and upon a program count match, replace the streaming bit(s) of the scan chain with bit(s) at the output of the FPGA function. This technical approach allows the logic input stream to be captured, and the logic output stream to be set to corrected values.

Breakpoints can be set by any one of several possible approaches, such as by a comparison with the program count of the program counter, indicated schematically at 42, or by another architecture compare function that the designer implements as part of the design process. Another approach could be based upon the number of clock cycles, with a number of clock cycles being selected to provide a given multiplication effect. Once a breakpoint is reached, the EC function triggers a halt of the system clock, by issuing a clock halt signal 44, and then the scan chains and FPGA macros execute to provide the EC logic function.

As described, all selected latches are scanned to the inputs of the FPGA structures of the FPGA macro. Once the FPGA macro completes the EC logic function, the downstream path of the cone of logic is replaced with the EC function so as to replace the defective logic function with the EC logic function.

The user has the option of running the EC function in a real time interactive debug fashion, or as an embedded logic EC, in which case the effect of the logic EC would be transparent to the end user, except for the duration of the pipeline stall.

The present invention provides flexible embedded Logic ECs within FPGA macros without requiring the contents of the latches of the logic function to be scanned to an external boundary to make the EC change externally.

The present invention provides a method that can be used either during product design and development, or used as a program logic fix.

The approach sets a breakpoint, scans the scan string structure to a fix register input of a set of FPGA macros, and executes a pipeline freeze. The logic function is scanned into an index RAM 40 of the set of replacement map functions, such that the downstream cone of logic of the logic function is replaced with the new EC logic function from the output of the FPGA macros. The pipeline freeze is then cleared, and the normal system logic function continues to execute.

The present invention also has applications in evaluating error recovery of an IC design, wherein data errors are injected through the embedded FPGA structure(s) into the IC, and then the logic function IC design is evaluated as to how well it handles error recovery.

While several embodiments and variations of the present invention for a system and method of providing error detection and correction capability in an IC using redundant logic cells and an embedded FPGA are described in detail herein, it should be apparent that the disclosure and teachings of the present invention will suggest many alternative designs to those skilled in the art.

The invention claimed is:

1. A method of providing error correction in an integrated circuit (IC) to enable the replacement of a defective logic function implemented within the IC, the method comprising:
    providing an embedded field programmable gate array (FPGA) in the IC to perform logic error correction;
    providing registers and associated circuitry designed to manipulate a scanned data stream;
    identifying a defective logic function within the IC;
    programming the embedded FPGA to replace the defective logic function;
    identifying all inputs in an input cone of logic of the defective logic function;
    directing all inputs in the input cone of logic of the defective logic function into the embedded FPGA, such that the embedded FPGA replaces the defective logic function with an error corrected version of the defective logic function, wherein said directing of all inputs in the input cone of logic of the defective logic function into the embedded FPGA includes:
        placing a logic macro implemented in the IC into a wait state; and
        scanning data from the defective logic function into the FPGA and the registers and associated circuitry to implement error correction of the defective logic function; and,
    identifying all outputs in an output cone of logic of the defective logic function; directing an output of the FPGA to the output cone of logic of the defective logic function, such that logic error correction is provided within the embedded FPGA structure of the IC,
    wherein a scan chain defines a data path through the IC, and a feedback loop is formed to direct corrected data of the scan chain to a register boundary of the defective logic function, whereupon the logic macro discontinues the wait state and resumes normal processing.

2. The method of claim 1, wherein a scan chain defines a data path through the IC, and corrected data of the scan chain is scanned back around, upstream or downstream, to an origin of the corrected data.

3. The method of claim 1, wherein a plurality of said embedded FPGAs are operatively connected for receiving scan chain data from one or more logic functions within an IC.

4. The method of claim 1, wherein a plurality of scan chains define a plurality of data paths through the IC, and a plurality of said embedded FPGAs being operatively connected for receiving said connected scan chain data from one more loge functions within said IC to correct data in the plurality of scan chains.

5. The method of claim 1, wherein a plurality of scan chains define a plurality of data paths through the IC, and data to be corrected in the plurality of scan chains are multiplexed into a single dedicated FPGA that is time multiplexed between the plurality of scan chains.

6. The method of claim 1, wherein a plurality of scan chains define a plurality of data paths through the IC, and data to be corrected in the plurality of scan chains are multiplexed into a single FPGA that is time multiplexed between the plurality of scan chains and also with normal system functions performed by the single FPGA.

7. The method of claim 1, further including:
identifying defective logic functions of the IC;
tracing a cone of logic of each identified defective logic function forward and backward to register boundaries; and,
selecting and implementing a correction solution comprising one or more of: correcting bad data bits, correcting upstream data, or correcting downstream data.

8. The method of claim 1, further including:
identifying defective logic functions in a logic macro implemented in the IC;
analyzing dataflow through the IC with respect to each identified defective logic function; and
identifying an optimum stage in the IC logic macro for which a logic breakpoint may be inserted to enable replacement of a defective logic function of said identified defective logic functions.

9. The method of claim 8, wherein the logic breakpoint is set by a comparison of a program count of a program counter for the IC with a preselected count of the program counter.

10. The method of claim 8, wherein the logic breakpoint is set based upon a preselected number of clock cycles of a clock of the IC.

11. The method of claim 1, further including:
identifying defective logic functions in a logic macro implemented in the IC;
analyzing dataflow though the IC with respect to each identified defective logic function; and
identifying an optimum point in a timing path of a defective logic function to insert a logic breakpoint to enable replacement of the defective logic function.

12. The method of claim 11, wherein the logic breakpoint is set by a comparison of a program count of a program counter for the IC with a preselected count of the program counter.

13. The method of claim 11, wherein the logic breakpoint is set based upon a preselected number of clock cycles of a clock of the IC.

14. The method of claim 1, further including extracting register transfer language (RTL), identifying and implementing RTL updates that are required and feasible.

15. The method of claim 1, wherein a plurality of scan chains define a plurality of data paths through the IC, and including using separate scan chain clocks and a separate FPGA clock to advance the data of one scan chain at a time independently of other scan chains and the FPGA.

16. The method of claim 1, wherein the FPGA includes an input correction register and an output correction register, and further including storing a program in a RAM to program which bits of a scan chain data stream are used to set the input correction register of the FPGA, and which bits of the scan chain data stream are replaced with bits from the output correction register of the FPGA.

17. The method of claim 16, wherein a bit mapping generated from the scan chain data steam corresponding to a stream of data output from the defective logic function passes through the input correction register, said scan chain data stream being captured in input latches of the input correction register if a program count of a program counter of the IC matches a preselected count.

18. The method of claim 1, further including providing a multiplexer at an output of the FPGA, and if a program count of a program counter of the IC matches a preselected count, using the multiplexer to replace bit(s) of a scan chain bit stream with bit(s) at the output of the FPGA.

19. A method of debugging and repairing logic errors of an integrated circuit (IC) performing a logic function, and having a system clock, the method comprising the steps of:
incorporating a scan chain function circuit in the IC;
setting a plurality of logic breakpoints in the logic function;
detecting a logic error in die IC;
cycling a scan chain data path through the IC and capturing an input data stream of the scan chain data path in a set of latches feeding an embedded field programmable gate array (FPGA);
initiating a waiting state of the IC logic function while a logic function error correction is identified and implemented by the embedded FPGA within a single clock cycle of a system clock for the IC;
repeating the cycling of the scan chain data path by feeding said input data stream of the scan chain data path to the embedded FPGA with a repaired logic function; and
resuming normal execution and clocking of the IC logic function,
wherein a plurality of scan chain data paths are provided through the IC, and with one or more said embedded FPGAs being operatively connected for receiving respective scan chain data from one more logic functions throughout the IC to correct data in the plurality of scan chain data paths.

* * * * *